US011690306B2

(12) United States Patent
Hsieh et al.

(10) Patent No.: US 11,690,306 B2
(45) Date of Patent: Jun. 27, 2023

(54) CORRELATED ELECTRON RESISTIVE MEMORY DEVICE AND INTEGRATION SCHEMES

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Wanbing Yi, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 148 days.

(21) Appl. No.: 17/407,170

(22) Filed: Aug. 19, 2021

(65) Prior Publication Data

US 2023/0053935 A1 Feb. 23, 2023

(51) Int. Cl.
*H01L 49/00* (2006.01)
*H10N 99/00* (2023.01)

(52) U.S. Cl.
CPC .................................. *H10N 99/03* (2023.02)

(58) Field of Classification Search
None
See application file for complete search history.

(56) References Cited

U.S. PATENT DOCUMENTS 10,937,831 B2 3/2021 Shifren et al.
10,937,873 B2 3/2021 Lee et al.
2006/0017080 A1* 1/2006 Tanaka ................ H01L 29/4908 257/295
2008/0106925 A1* 5/2008 Paz de Araujo ....... H10B 63/20 257/E21.001
2008/0106926 A1* 5/2008 Brubaker ............... H10B 63/30 257/E21.665
2013/0200457 A1* 8/2013 Ogimoto ............. H01L 29/7869 257/411
2014/0209850 A1* 7/2014 Ogimoto ............. H10N 70/235 257/4
2015/0001537 A1* 1/2015 May .................... H01L 29/7827 257/43
2019/0035906 A1* 1/2019 Inoue ..................... H10N 99/03

FOREIGN PATENT DOCUMENTS

WO 2015199706 A1 12/2015

* cited by examiner

*Primary Examiner* — Benjamin P Sandvik
(74) *Attorney, Agent, or Firm* — David Cain

(57) ABSTRACT

A resistive memory device is provided. The resistive memory device comprises a first metal oxide layer above a body electrode. A correlated electron layer located between a source and a drain and above the first metal oxide layer. A gate above a bottom portion of the correlated electron layer.

20 Claims, 3 Drawing Sheets

CORRELATED ELECTRON RESISTIVE MEMORY DEVICE AND INTEGRATION SCHEMES

FIELD OF THE INVENTION

The disclosed embodiments relate generally to correlated electron resistive memory devices, and more particularly, to four-terminal correlated electron resistive memory devices and integration schemes.

BACKGROUND

A resistive memory device may store data based on its resistance state. An example of a resistive memory device is a correlated electron (CE) resistive memory device. A correlated electron resistive memory device may include a correlated electron layer between two electrodes. The correlated electron layer may switch reversibly between a conductive state and an insulating state, called a Mott transition. When the correlated electron layer is in the conductive state, the resistive memory device is in a low resistance state. Conversely, when the correlated electron layer is in the insulating state, the resistive memory device is in a high resistance state. The correlated electron layer may be switched from the conductive or low resistance state, to an insulating state or high resistance state by application of a selected voltage across the electrodes.

Resistive memory devices operated at high switching speeds are often associated with high leakage currents and poor endurance due to breakdown of the correlated electron layer. Thus, there is a need to overcome the challenges mentioned above.

SUMMARY

In an aspect of the present disclosure, a resistive memory device is provided. The resistive memory device comprises a first metal oxide layer above a body electrode. A correlated electron layer may be located between a source and a drain and above the first metal oxide layer. A gate may be arranged above a bottom portion of the correlated electron layer.

In another aspect of the present disclosure, a resistive memory device is provided. The resistive memory device comprises a first metal oxide layer above a body electrode. A correlated electron layer having a bottom portion, whereby the bottom portion of the correlated electron layer may be located at least partially between a source and a drain and above the first metal oxide layer. A gate may be arranged above the bottom portion of the correlated electron layer. The gate and the bottom portion of the correlated electron layer may overlap the body electrode.

In yet another aspect of the present disclosure, a method of fabricating a resistive memory device is provided. The method comprises forming a body electrode and a first metal oxide layer above the body electrode. A source and a drain may be formed. A correlated electron layer may be formed above the first metal oxide layer and between the source and the drain. A gate may be formed above a bottom portion of the correlated electron layer.

Numerous advantages may be derived from the embodiments described below. The embodiments provide resistive memory devices with a high switching speed, low leakage current and good endurance. Due to the four-terminal configuration, a read voltage of the resistive memory device may be higher than the set or reset voltages, enabling high read voltage application.

BRIEF DESCRIPTION OF THE DRAWINGS

The disclosed embodiments will be better understood from a reading of the following detailed description, taken in conjunction with the accompanying drawings.

Figure 1:
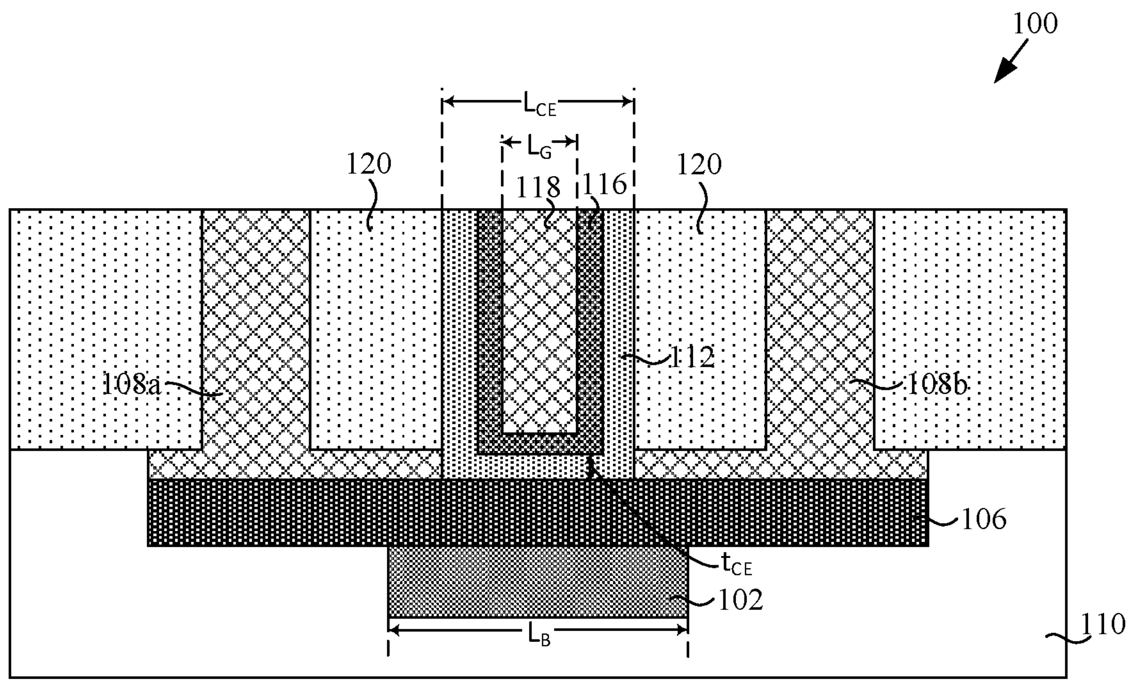
FIG. 1 illustrates a cross-section view of a resistive memory device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1 illustrates a resistive memory device 100, according to an embodiment of the disclosure. The resistive memory device 100 may include a body electrode 102, a metal oxide layer 106, a source 108*a*, a drain 108*b*, a correlated electron layer 112, a metal oxide layer 116 and a gate 118. The metal oxide layer 106 may be arranged over the body electrode 102. The body electrode 102 may refer to an electrode arranged below the gate 118. The body electrode 102 may be connected to an input terminal, to provide an additional biasing electrode for the device 100 besides the gate 118, the source 108*a* and the drain 108*b*. The source 108*a* and the drain 108*b* may be spaced apart and arranged over the metal oxide layer 106. The correlated electron layer 112 may be arranged over the metal oxide layer 106 and between the source 108*a* and the drain 108*b*. The correlated electron layer 112 may have a bottom portion connected to side wall portions. The metal oxide layer 116 may have a bottom portion connected to side wall portions and may be arranged conformally over the correlated electron layer 112, separating the gate 118 and the correlated electron layer 112. The gate 118 may be arranged above the bottom portions of the metal oxide layer 116 and the correlated electron layer 112. In an alternative embodiment, the metal oxide layer 106 may be a transition metal oxide layer. In yet another embodiment, the metal oxide layer 116 may be a transition metal oxide layer. The metal oxide layer 116 may act as a buffer layer between the correlated electron layer 112 and the gate 118. Additionally, the metal oxide layer 116 and metal oxide layer 106 may have their valence states overlap with correlated electron layer 112 resulting in the correlated electron layer 112 having 2 valence states, metallic and insulator states.

The gate 118 may have a bottom surface and side surfaces and the metal oxide layer 116 may be arranged next to the bottom and side surfaces of the gate 118. The correlated electron layer 112 may be arranged next to the metal oxide layer 116. The source 108*a* and the drain 108*b* may each have a lower portion and an upper portion. At least a bottom portion of the correlated electron layer 112 may be arranged between the lower portions of the source 108*a* and drain 108*b*. The upper portions of the source 108*a* and drain 108*b* may be spaced apart from the gate 118, the metal oxide layer 116 and the correlated electron layer 112. An interlayer dielectric layer 120 may be arranged between the upper portions of the source 108*a* and drain 108*b* and the correlated electron layer 112. In one embodiment, the lower portions of the source 108*a* and drain 108*b*, the correlated electron layer 112, the metal oxide layer 106 and the body electrode 102 may be arranged in a substrate 110. In another embodiment, the metal oxide layer 106 and the body electrode 102 may be arranged in the substrate 110, while the lower portions of the source 108*a* and drain 108*b* and the correlated electron layer 112 may be arranged above the substrate 110. The substrate 110 may be made of a suitable semiconductor material, for example, silicon.

In another embodiment, the resistive memory device 100 may be arranged in a metallization layer of a device. For example, the source 108*a* and drain 108*b*, the correlated electron layer 112, the metal oxide layer 106 and the body electrode 102 may be arranged in a suitable dielectric material including silicon dioxide ($SiO_2$), high density plasma (HDP) undoped silicate glass (USG), tetraethyl orthosilicate (TEOS), or any other suitable dielectric material. The body electrode 102 may be made of a suitable conductive material, for example, titanium nitride (TiN), tantalum nitride (TaN), or tungsten (W). The interlayer dielectric layer 120 may be made of a suitable dielectric material, for example, silicon dioxide ($SiO_2$), high density plasma (HDP) undoped silicate glass (USG), tetraethyl orthosilicate (TEOS), or any other suitable dielectric material.

The metal oxide layer 106 may be made of, for example, nickel oxide ($NiO_x$), cobalt oxide ($CoO_x$), yttrium oxide ($YO_x$), titanium oxide ($TiO_x$), zirconium oxide ($ZrO_x$), hafnium oxide ($HfO_x$), chromium oxide ($CrO_x$), molybdenium oxide ($MoO_x$), tungsten oxide ($WO_x$), rhodium oxide ($RhO_x$), iridium oxide ($IrO_x$) and any other suitable transition metal oxides. In another embodiment, the metal oxide layer 106 may be made of a doped metal oxide, for example nitrogen doped nickel oxide (N—$NiO_x$). The correlated electron layer 112 may be made of, for example, nickel oxide, cobalt oxide, iron oxide, yttrium oxide, vanadium dioxide ($VO_2$), vanadium trioxide ($V_2O_3$), chromium dioxide ($CrO_2$), titanium dioxide ($TiO_2$), manganese oxide ($MnO_x$), and any other suitable transition metal oxides, strontium ruthenate ($Sr_2RuO_4$ or $SrRuO_3$), and perovskites such as chromium (Cr) doped strontium titanate, lanthanum titanate, and the manganite family including praseodymium calcium manganite, and praseodymium lanthanum manganite. In one embodiment, oxides incorporating elements with incomplete d and f orbital shells may exhibit sufficient resistance switching properties to serve as a correlated electron layer 112. The transition metal oxides may be doped with extrinsic ligands, for example, carbon, which may stabilize variable resistance properties by passivating interfaces and allowing for adjustable voltages and resistances. For example, the metal oxide layer 106 may be made of nickel oxide and the correlated electron layer 112 may be made of carbon doped nickel oxide. In another embodiment, the correlated electron layer 112 may be made of other transition metal compounds, for example, $[M(chxn)_2Br]Br_2$ where M may include platinum (Pt), palladium (Pd), or nickel (Ni), and chxn includes 1R,2R-cyclohexanediamine. The metal oxide layer 116 may be made of, for example, nickel oxide ($NiO_x$) cobalt oxide ($CoO_x$), yttrium oxide ($YO_x$), titanium oxide ($TiO_x$), zirconium oxide ($ZrO_x$), hafnium oxide ($HfO_x$), chromium oxide ($CrO_x$), molybdenium oxide ($MoO_x$), tungsten oxide ($WO_x$), rhodium oxide ($RhO_x$), iridium oxide ($IrO_x$) and any other suitable transition metal oxides. In another embodiment, the metal oxide layer 116 may be made of a doped metal oxide, for example, nitrogen doped nickel oxide (N—$NiO_x$). In one embodiment, the metal oxide layers 106 and 116 may be made of the same material. In another embodiment, the metal oxide layers 106 and 116 may be made of different materials.

The source 108*a* and the drain 108*b* may be made of a suitable conductive material, for example, titanium nitride (TiN), tantalum nitride (TaN), or tungsten (W). The gate 118 may be made of a suitable conductive material, for example, titanium nitride (TiN), tantalum nitride (TaN), or tungsten (W).

A length, $L_{CE}$, of the correlated electron layer 112 between the source 108*a* and drain 108*b* may be longer than a thickness, $t_{CE}$, of the correlated electron layer 112 below the gate 118. The length, $L_{CE}$, may be in the range of 30 to 80 nm. The correlated electron layer 112 may have a thickness, $t_{CE}$, in the range of 2 to 4 nm. The metal oxide layer 106 may have a thickness in the range of 5 to 30 nm. The metal oxide layer 116 may have a thickness in the range of 2 to 20 nm. In a preferred embodiment, the total thicknesses of the metal oxide layer 116, the correlated electron layer 112 and the metal oxide layer 106 between the gate 118 and the body electrode 102 may be less than the length $L_{CE}$ of the correlated electron layer 112 to enable fast switching speed.

A possible operating condition for the resistive memory device 100 is outlined below. The correlated electron layer 112 may initially be in a conductive state and the resistive memory device 100 may be in a low resistance state. During a reset operation, a reset voltage may be applied to the gate 118. The body electrode 102 may be grounded. The source 108*a* and the drain 108*b* may be unbiased or floating. The correlated electron layer 112 may switch from the conductive state to an insulating state as electrons are removed from the Fermi level by the applied reset voltage, thereby opening the bandgap. The removal of electrons from the Fermi level increases coulombic repulsion between the electrons in the correlated electron layer 112 and reduces the number of free or conducting electrons, thereby making the correlated electron layer 112 insulating. The term, "Fermi level" may refer to the highest energy level that an electron may occupy at absolute zero temperature. The term, "band gap" may refer to the minimum amount of energy required by an electron to break free from its bound state. The resistive memory device 100 may be in a high resistance state after the reset operation.

During a set operation, a set voltage may be applied to the gate 118. The set voltage may be higher than the reset voltage. The biasing conditions for the body electrode 102, source 108*a* and drain 108*b* may be like the reset operation. The correlated electron layer 112 may switch from the insulating state to the conductive state through a Mott transition, thereby switching the resistive memory device 100 from the high resistance state to a low resistance state. In a Mott transition, a material may switch from the insulating state to the conductive state if a Mott transition condition occurs. The Mott criteria is defined by $(n_c)^{1/3}a \sim 0.25$, where $n_c$ is a concentration of electrons and "a" is the Bohr radius. When a critical carrier concentration in the correlated electron layer 112 is achieved such that the Mott criteria is met, the Mott transition may occur and the correlated electron layer 112 may switch from the insulating state to the conductive state. The thin correlated electrode layer 112 below the gate 118 enables low voltage set and reset operations and high switching speed.

During a read operation, a read voltage may be applied to the drain 108*b* and the source 108*a* may be grounded. The gate 118 and the body electrode 102 may be unbiased or floating. A current may be detected at the drain 108*b*, depending on the resistivity of the correlated electron layer 112. As the length $L_{CE}$ of the correlated electron layer 112 is longer than its thickness, the current measured when the correlated electron layer 112 is in an insulating state is low, which is advantageous for device operation as it translates to a low leakage for the device 100. A large window between the current measured when the correlated electron layer 112 is in an insulating state and the conductive state may be obtained. Additionally, the read voltage may be higher than the set or reset voltages to give a better readout without affecting the resistivity state of the correlated electron layer 112.

A length, $L_G$, of the gate 118 may be shorter than the length, $L_{CE}$, of the correlated electron layer 112. A length, $L_B$, of the body electrode 102 may be longer than or at least equal to the length $L_{CE}$. The gate 118, the metal oxide layer 116 and the correlated electron layer 112 may be arranged over the body electrode 102. Lower portions of the source 108*a* and the drain 108*b* next to the correlated electron layer 112 may partially overlap the body electrode 102. A set or reset voltage applied between the gate 118 and the body electrode 102 will be effectively applied to the correlated electron layer 112 across a channel region between the source 108*a* and the drain 108*b*.

Figure 2:
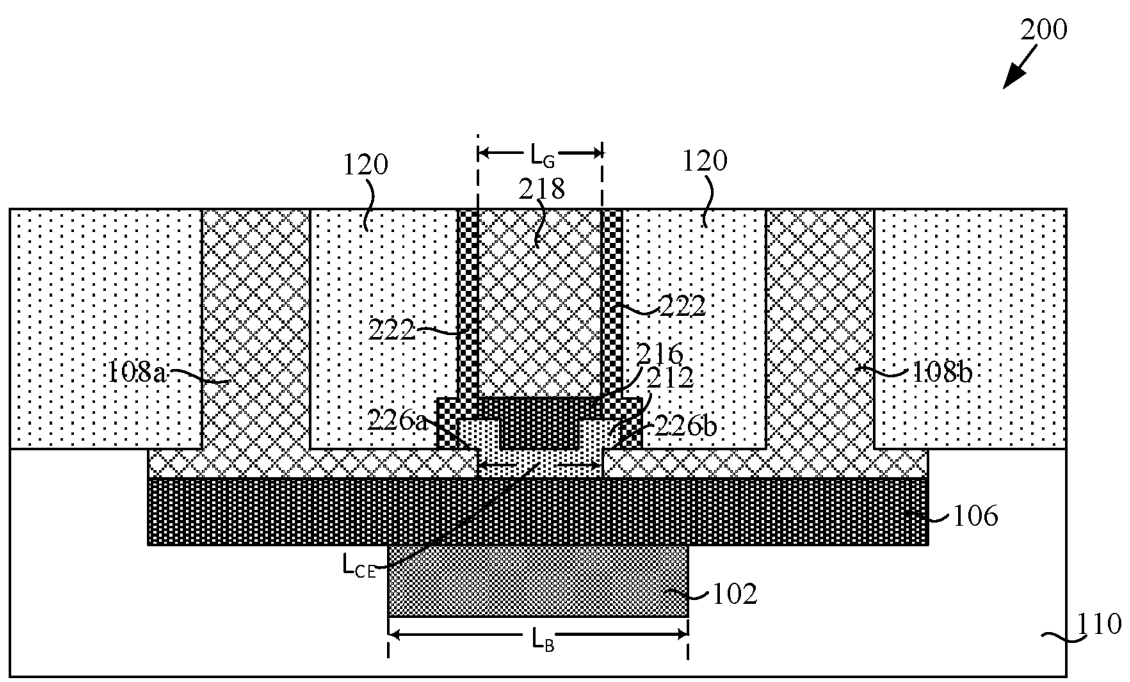
FIG. 2 illustrates a cross-section view of a resistive memory device, according to another embodiment of the disclosure.

FIG. 2 illustrates a cross-section view of a resistive memory device 200, according to another embodiment of the disclosure. Like features in FIG. 1 are indicated as like numerals in FIG. 2. In contrast to the resistive memory device 100 shown in FIG. 1, the resistive memory device 200 may have spacer structures 222 arranged next to side surfaces of a gate 218. A length, $L_G$, of the gate 218 may be at least equal to or longer than a length, $L_{CE}$, of a bottom portion of a correlated electron layer 212 arranged between a source 108*a* and a drain 108*b*. The gate 218 may overlap the portion of the correlated electron layer 212 between the source 108*a* and the drain 108*b*. The bottom portion of the correlated electron layer 212 may be connected to end portions. The end portions of the correlated electron layer 212 may at least partially overlap a top surface 226*a* of the lower portion of the source 108*a* and a top surface 226*b* of the lower portion of the drain 108*b*. A metal oxide layer 216 may be arranged between a bottom surface of the gate 218 and the correlated electron layer 212.

Figure 3A:
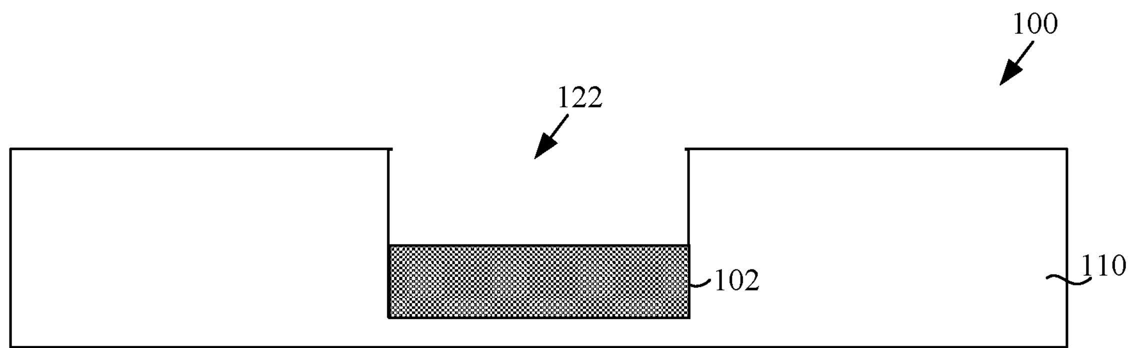
FIGS. 3A to 3C illustrate a fabrication process flow for the resistive memory device shown in FIG. 1, according to some embodiments of the disclosure.
Figure 3B:
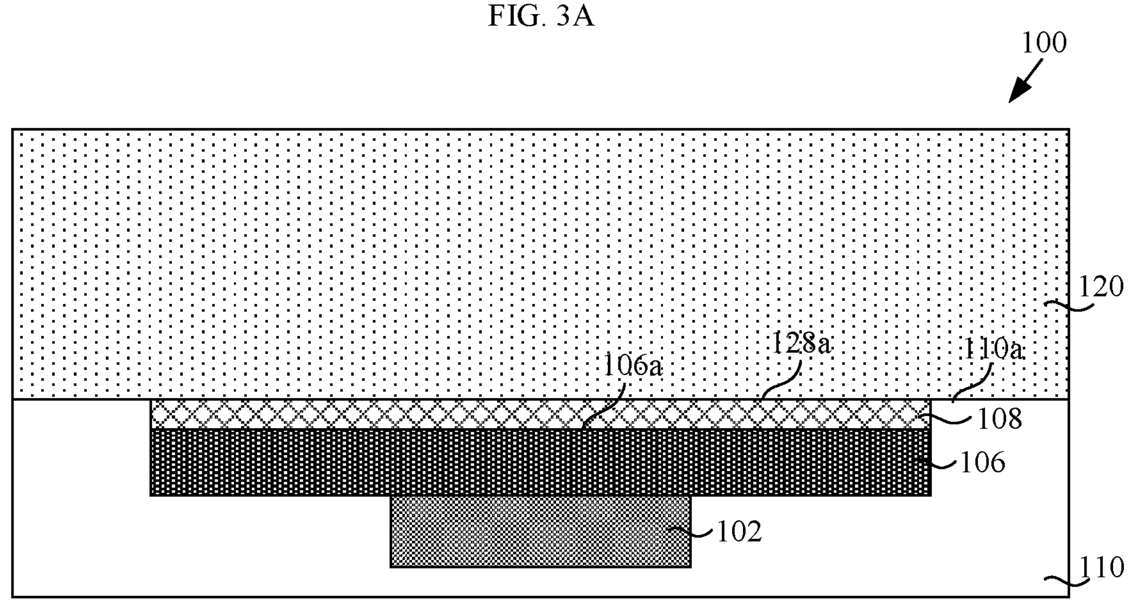
Figure 3C:
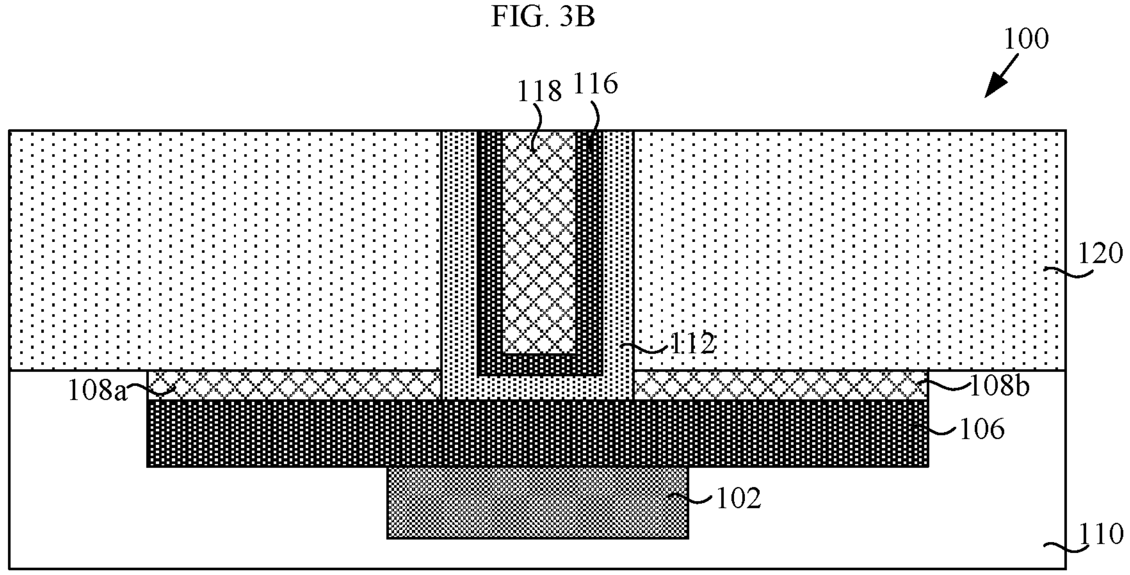

FIGS. 3A to 3C illustrate a fabrication process flow for the resistive memory device 100 shown in FIG. 1, according to some embodiments of the disclosure. FIG. 3A illustrates a partially completed resistive memory device 100 after formation of a body electrode 102 in a substrate 110, according to an embodiment of the disclosure. Referring to FIG. 3A, the formation of the body electrode 102 may include forming an opening 122 in the substrate 110 followed by deposition of a suitable conductive material, for example, titanium nitride (TiN), tantalum nitride (TaN), or tungsten (W) to fill up the opening 122. The deposition process may be by atomic layer deposition (ALD), chemical vapor deposition (CVD), physical vapor deposition (PVD) or any other suitable deposition processes. A suitable planarization process, for example, chemical mechanical planarization (CMP), may be used to remove the conductive material from a top surface of the substrate 110 leaving behind the conductive material in the opening 122 thereby forming the body electrode 102.

FIG. 3B illustrates a partially completed resistive memory device 100 after formation of a metal oxide layer 106, a conductive layer 108 and an interlayer dielectric layer 120, according to an embodiment of the disclosure. Referring to FIG. 3B, the metal oxide layer 106 may be formed over the body electrode 102 and the substrate 110. The conductive layer 108 may be formed over the metal oxide layer 106. Both the metal oxide layer 106 and the conductive layer 108 may be formed in the substrate 110. The formation of the metal oxide layer 106 and the conductive layer 108 may include laterally extending an upper portion of the opening 122. The lateral extension of the upper portion of the opening 122 may be achieved by patterning and etching a portion of the substrate 110 laterally displaced from the upper portion of the opening 122. The body electrode 102 may not need to be protected during the patterning process. A layer of a suitable transition metal oxide, for example, nickel oxide ($NiO_x$), cobalt oxide ($CoO_x$), yttrium oxide ($YO_x$), titanium oxide ($TiO_x$), zirconium oxide ($ZrO_x$), hafnium oxide ($HfO_x$), chromium oxide ($CrO_x$), molybdenium oxide ($MoO_x$), tungsten oxide ($WO_x$), rhodium oxide ($RhO_x$), iridium oxide ($IrO_x$) and any other suitable transition metal oxides may be deposited in the opening. A suitable planarization process, for example, chemical mechanical planarization (CMP), may be used to remove the transition metal oxide from the top surface of the substrate 110. A wet etch or dry etch process may be used to remove a top portion of the transition metal oxide layer to form the metal oxide layer 106 having a top surface 106*a* which is lower than the top surface 110*a* of the substrate 110. A layer of a suitable conductive material, for example, titanium nitride (TiN), tantalum nitride (TaN), or tungsten (W), may then be deposited over the top surface 106*a* of the metal oxide layer 106 in the opening and the top surface 110*a* of the substrate 110. A suitable planarization process, for example, chemical mechanical planarization (CMP), may be used to remove the conductive material from the top surface 110*a* of the substrate 110, leaving behind the conductive material over the metal oxide layer 106, thereby forming the conductive layer 108 having a top surface 128*a* that is substantially coplanar with the top surface 110*a* of the substrate. The formation of the interlayer dielectric layer 120 may include depositing a layer of a suitable dielectric material, for example, silicon dioxide ($SiO_2$), high density plasma (HDP) undoped silicate glass (USG), tetraethyl orthosilicate (TEOS), or any other suitable dielectric material, over the conductive layer 108 and the substrate 110.

FIG. 3C illustrates a partially completed resistive memory device 100 after formation of a source 108*a*, a drain 108*b*, a correlated electron layer 112, a metal oxide layer 116 and a gate 118, according to an embodiment of the disclosure. An opening may first be formed in the interlayer dielectric layer 120 and the conductive layer 108. The opening may separate the conductive layer 108 to thereby form a lower portion of the source 108*a* and the drain 108*b*. A layer of a suitable material is deposited in the opening to cover the bottom surface and side surfaces of the opening, thereby forming the correlated electron layer 112 having a bottom portion connected to side wall portions which are conformal to the side surfaces of the opening. Examples of a suitable material for the correlated electron layer 112 include ligand-doped nickel oxide, cobalt oxide, iron oxide, yttrium oxide, vanadium dioxide ($VO_2$), vanadium trioxide ($V_2O_3$), chromium dioxide ($CrO_2$), titanium dioxide ($TiO_2$), manganese oxide ($MnO_x$), and any other suitable transition metal oxides, strontium ruthenate ($Sr_2RuO_4$ or $SrRuO_3$), and perovskites such as chromium (Cr) doped strontium titanate, lanthanum titanate, and the manganite family including praseodymium calcium manganite, and praseodymium lanthanum manganite. A transition metal oxide layer may be deposited over the correlated electron layer in the opening to form the metal oxide layer 116. A suitable material for the metal oxide layer 116 may include, for example, nickel oxide ($NiO_x$), cobalt oxide ($CoO_x$), yttrium oxide ($YO_x$), titanium oxide ($TiO_x$), zirconium oxide ($ZrO_x$), hafnium oxide ($HfO_x$), chromium oxide ($CrO_x$), molybdenium oxide ($MoO_x$), tungsten oxide ($WO_x$), rhodium oxide ($RhO_x$), iridium oxide ($IrO_x$) and any other suitable transition metal oxides. The transition metal oxide layer may be formed conformally on the side surfaces and over the correlated electron layer 112 at the bottom of the opening. The formation of the gate 118 may include depositing a layer of a suitable conductive material, for example, titanium nitride (TiN), tantalum nitride (TaN), or tungsten (W), over the metal oxide layer 116. A suitable planarization process, for example, chemical mechanical planarization, may be used to remove the top portions of the gate 118, the metal oxide layer 116 and the correlated electron layer 112 such that the top surface of the gate 118, the top surface of correlated electron layer 112 and the top surface of the metal oxide layer 116 are substantially coplanar with the top surface of the interlayer dielectric layer 120.

The process continues to form the resistive memory device 100 illustrated in FIG. 1. Referring to FIG. 1, an upper portion of the source 108*a* may be formed over the lower portion of the source 108*a*. An upper portion of the drain 108*b* may be formed over the lower portion of the drain 108*b*. Openings are formed in the interlayer dielectric layer 120 over the lower portion of the source 108*a* and the lower portion of the drain 108*b*. A suitable conductive material, for example, titanium nitride (TiN), tantalum nitride (TaN), tungsten (W) or copper (Cu), may be deposited in the opening. A suitable planarization process, for example, chemical mechanical planarization, may be used to remove the conductive material from the top surface of the interlayer dielectric layer 120 and leaving behind the conductive material in the openings to thereby form the upper portions of the source 108*a* and drain 108*b*. In an alternative embodiment, the upper portions of the source 108*a* and the drain 108*b* may be formed before the formation of the gate 118, metal oxide layer 116 and correlated electron layer 112.

Figure 4A:
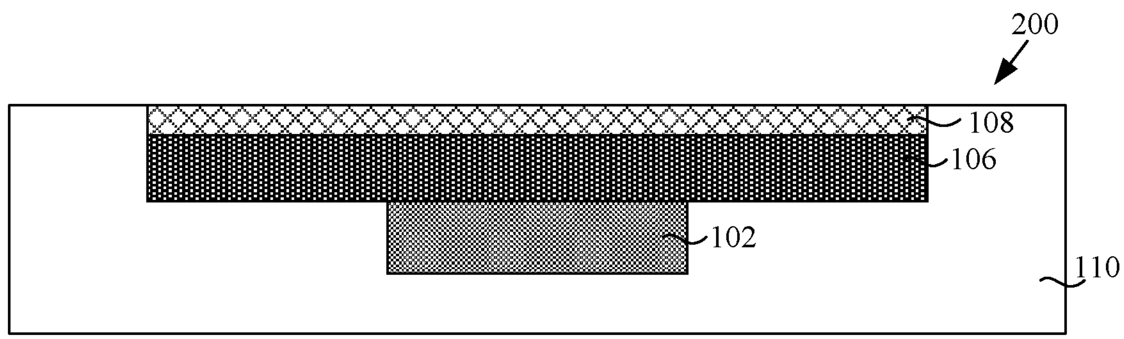
FIGS. 4A to 4C illustrate a fabrication process flow for the resistive memory device shown in FIG. 2, according to some embodiments of the disclosure.
Figure 4B:
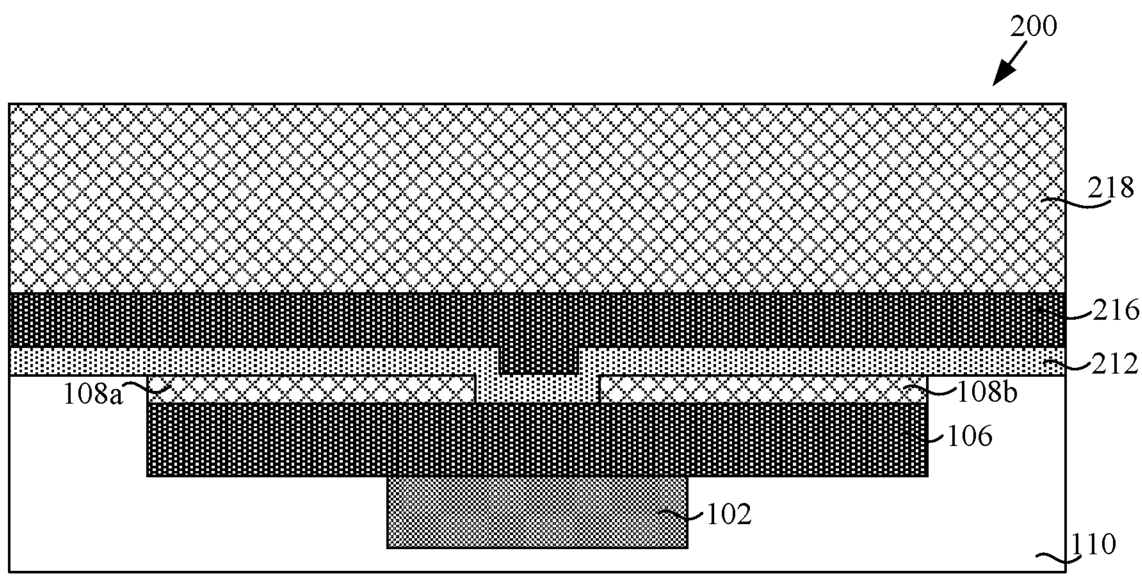
Figure 4C:
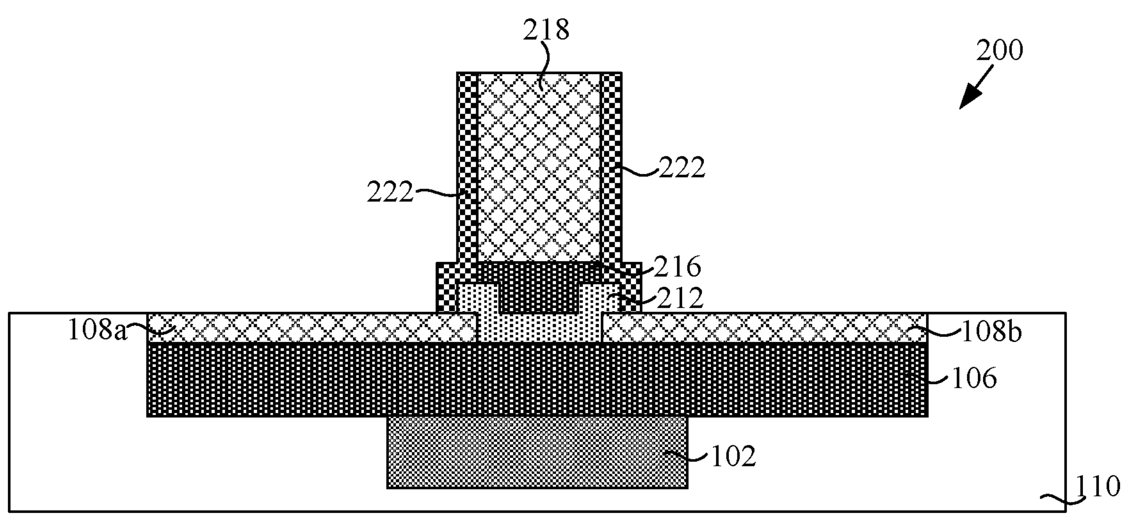

FIGS. 4A to 4C illustrate a fabrication process flow for the resistive memory device 200 shown in FIG. 2, according to some embodiments of the disclosure. FIG. 4A illustrates a partially completed resistive memory device 200 after the formation of a body electrode 102, a metal oxide layer 106 and a conductive layer 108 in a substrate 110, according to an embodiment of the disclosure. The fabrication process for the body electrode 102, the metal oxide layer 106 and the conductive layer 108 may be like the fabrication process of like features of the resistive memory device 100 illustrated in FIGS. 3A and 3B.

FIG. 4B illustrates a partially completed resistive memory device 200 after the formation of a source 108*a* and a drain 108*b*, a correlated electron layer 212, a metal oxide layer 216 and a gate layer 218, according to an embodiment of the disclosure. Referring to FIG. 4B, the formation of a lower portion of the source 108*a* and the drain 108*b* may include patterning the conductive layer 108 to form the lower portion of the source 108*a* and the drain 108*b*. The formation of the correlated electron layer 212 may include depositing a layer of a suitable material, for example, ligand-doped nickel oxide, cobalt oxide, iron oxide, yttrium oxide, vanadium dioxide ($VO_2$), vanadium trioxide ($V_2O_3$), chromium dioxide ($CrO_2$), titanium dioxide ($TiO_2$), manganese oxide ($MnO_x$), and any other suitable transition metal oxides, strontium ruthenate ($Sr_2RuO_4$ or $SrRuO_3$), and perovskites such as chromium (Cr) doped strontium titanate, lanthanum titanate, and the manganite family including praseodymium calcium manganite, and praseodymium lanthanum manganite. The correlated electron layer 212 may be deposited over the source 108*a*, the drain 108*b*, the metal oxide layer 106 and a top surface of the substrate 110. The formation of the metal oxide layer 216 may include depositing a layer of a suitable transition metal oxide, for example, nickel oxide ($NiO_x$), cobalt oxide ($CoO_x$), yttrium oxide ($YO_x$), titanium oxide ($TiO_x$), zirconium oxide ($ZrO_x$), hafnium oxide ($HfO_x$), chromium oxide ($CrO_x$), molybdenium oxide ($MoO_x$), tungsten oxide ($WO_x$), rhodium oxide ($RhO_x$), iridium oxide ($IrO_x$) and any other suitable transition metal oxides. The metal oxide layer 216 may be deposited over the correlated electron layer 212. The formation of the gate layer 218 may include depositing a layer of a suitable conductive material, for example, titanium nitride (TiN), tantalum nitride (TaN), or tungsten (W). The gate layer 218 may be deposited over the metal oxide layer 216.

FIG. 4C illustrates a partially completed resistive memory device 200 after patterning of the correlated electron layer 212, the metal oxide layer 216, the gate 218 and formation of spacer structures 222, according to an embodiment of the disclosure. Referring to FIG. 4C, the gate layer 218 and the metal oxide layer 216 may be patterned to expose the correlated electron layer 212. The patterning process forms the gate 218. The correlated electron layer 212 may be patterned to expose the lower portions of the source 108*a* and the drain 108*b*. Spacer structures 222 may be formed over side surfaces of the gate 218, the metal oxide layer 216 and the correlated electron layer 212. The formation of the spacer structures 222 may include depositing a layer of a suitable dielectric material, for example, silicon dioxide, silicon nitride, or any other suitable dielectric material over the gate 218, the metal oxide layer 216 and the correlated electron layer 212 followed by anisotropic etching. The term "anisotropic etching" may refer to an etching process that is directional in nature.

The process continues to form the resistive memory device 200 illustrated in FIG. 2. Referring to FIG. 2, an interlayer dielectric layer 120 may be formed over the gate 218, the spacer structures 222 and the lower portion of the source 108*a* and the drain 108*b*. The formation of the interlayer dielectric layer 120 may include depositing a layer of a suitable dielectric material, for example, silicon dioxide ($SiO_2$), high density plasma (HDP) undoped silicate glass (USG), tetraethyl orthosilicate (TEOS), or any other suitable dielectric material, like the formation of the interlayer dielectric layer 120 shown in FIG. 3B. A suitable planarization process, for example, chemical mechanical planarization, may be used to planarize the interlayer dielectric layer 120 and expose a top surface of the gate 218 and spacer structures 222. Upper portions of the source 108*a* and the drain 108*b* may be subsequently formed, like the formation of the upper portions of the source 108*a* and the drain 108*b* shown in FIG. 1.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A resistive memory device comprising:

a first metal oxide layer above a body electrode;

a correlated electron layer located between a source and a drain and above the first metal oxide layer; and a gate above a bottom portion of the correlated electron layer.

2. The resistive memory device of claim 1, further comprising:

a second metal oxide layer above the bottom portion of the correlated electron layer, wherein the second metal oxide layer separates the gate from the correlated electron layer.

3. The resistive memory device of claim 1, wherein the source and the drain are over the first metal oxide layer.

4. The resistive memory device of claim 1, wherein a length of the correlated electron layer between the source and the drain is longer than a thickness of the correlated electron layer.

5. The resistive memory device of claim 4, wherein a length of the gate is shorter than the length of the correlated electron layer between the source and the drain.

6. The resistive memory device of claim 5, wherein a length of the body electrode is at least equal to the length of the correlated electron layer between the source and the drain.

7. The resistive memory device of claim 2, wherein the gate has a bottom surface, and the second metal oxide layer is arranged next to the bottom surface of the gate.

8. The resistive memory device of claim 7, wherein the gate has side surfaces, and the second metal oxide layer is arranged next to the side surfaces of the gate.

9. The resistive memory device of claim 7, wherein the gate has side surfaces, and spacer structures are arranged next to the side surfaces of the gate.

10. The resistive memory device of claim 4, wherein a length of the gate is at least equal to the length of the correlated electron layer between the source and the drain.

11. The resistive memory device of claim 10, wherein a length of the body electrode is at least equal to the length of the correlated electron layer between the source and the drain.

12. The resistive memory device of claim 10, wherein the correlated electron layer partially overlaps a top surface of a lower portion of the source and a top surface of a lower portion of the drain.

13. The resistive memory device of claim 1, wherein the first metal oxide layer is a transition metal oxide layer.

14. The resistive memory device of claim 2, wherein the second metal oxide layer is a transition metal oxide layer.

15. A resistive memory device comprising:

a first metal oxide layer above a body electrode;

a correlated electron layer having a bottom portion, wherein the bottom portion of the correlated electron layer is located at least partially between a source and a drain and above the first metal oxide layer;

a gate above the bottom portion of the correlated electron layer; and the gate and the bottom portion of the correlated electron layer overlap the body electrode.

16. The resistive memory device of claim 15, further comprising:

a second metal oxide layer above the bottom portion of the correlated electron layer, wherein the second metal oxide layer is between the gate and the correlated electron layer.

17. The resistive memory device of claim 15, wherein the source and the drain are over the first metal oxide layer.

18. The resistive memory device of claim 17, wherein the source and the drain partially overlap the body electrode.

19. A method of fabricating a resistive memory device, the method comprising:

forming a body electrode and a first metal oxide layer above the body electrode;

forming a source and a drain;

forming a correlated electron layer above the first metal oxide layer and between the source and the drain; and forming a gate above a bottom portion of the correlated electron layer.

20. The method of claim 19, wherein the formation of the source and the drain further comprises:

forming the source and the drain over the first metal oxide layer.

* * * * *